US011133567B2

(12) United States Patent
Zhang et al.

(10) Patent No.: US 11,133,567 B2
(45) Date of Patent: Sep. 28, 2021

(54) CAPACITIVE COUPLING TUNER

(71) Applicant: NOKIA SHANGHAI BELL CO., LTD., Shanghai (CN)

(72) Inventors: Yunchi Zhang, Wallingford, CT (US); Yin-Shing Chong, Middletown, CT (US)

(73) Assignee: NOKIA SHANGHAI BELL CO., LTD., Shanghai (CN)

( * ) Notice: Subject to any disclaimer, the term of this patent is extended or adjusted under 35 U.S.C. 154(b) by 24 days.

(21) Appl. No.: 16/588,142

(22) Filed: Sep. 30, 2019

(65) Prior Publication Data

US 2021/0098855 A1   Apr. 1, 2021

(51) Int. Cl.
*H01P 7/10* (2006.01)
*H03H 9/24* (2006.01)
*H03H 7/01* (2006.01)
*H03H 7/46* (2006.01)
*H03H 9/02* (2006.01)

(52) U.S. Cl.
CPC ............ *H01P 7/10* (2013.01); *H03H 7/0153* (2013.01); *H03H 7/463* (2013.01); *H03H 9/24* (2013.01); *H03H 2009/02165* (2013.01)

(58) Field of Classification Search
CPC ........ H01P 7/10; H03H 7/0153; H03H 7/463; H03H 9/24; H03H 2009/02165
See application file for complete search history.

(56) References Cited

U.S. PATENT DOCUMENTS

| 6,549,104 | B1 * | 4/2003 | Ghosh | ................... H01P 7/06 331/107 DP |
| 6,806,791 | B1 * | 10/2004 | Wang | .................... H01P 1/2138 333/134 |
| 7,180,391 | B2 * | 2/2007 | Ala-Kojola | ........... H01P 1/2053 333/134 |
| 8,836,450 | B2 * | 9/2014 | Pari | ....................... H01P 1/2053 333/203 |
| 8,847,709 | B2 * | 9/2014 | Tiihonen | ............... H01P 1/2084 333/202 |

(Continued)

FOREIGN PATENT DOCUMENTS

| CN | 1776958 A | 5/2006 |
| WO | WO 2017/099296 A1 | 6/2017 |

OTHER PUBLICATIONS

Akash Anand et al., "Substrate-Integrated Coaxial-Cavity Filter with Tunable Center Frequency and Reconfigurable Bandwidth," Conference Paper, WAMICON 2014, Jun. 2014. https://www.researchgate.net/publication/269294723_Substrate-integrated_Coaxial-cavity_filter_with_tunable_center_frequency_and_reconfigurable_bandwidth.

*Primary Examiner* — Dinh T Le

(74) *Attorney, Agent, or Firm* — Squire Patton Boggs (US) LLP

(57) ABSTRACT

Apparatuses, methods of assembling a resonator, and methods of tuning a resonator are provided. An example apparatus may include at least one resonator, at least one input tap coupled to the at least one resonator via capacitive coupling, and at least one tuning element that comprises at least one plate of material. At least a portion of the at least one tuning element may be configured to be positioned between the at least one resonator and the at least one input tap. The at least one tuning element may be configured to be positioned between the at least one resonator and the at least one input tap by at least one spring retention element.

18 Claims, 6 Drawing Sheets

(56) References Cited

U.S. PATENT DOCUMENTS

| | | |
|---|---|---|
| 2009/0153271 A1* | 6/2009 | Park ................. H01P 1/205 333/203 |
| 2010/0007442 A1 | 1/2010 | Narhi |
| 2011/0001583 A1 | 1/2011 | Rossiter et al. |
| 2012/0119850 A1 | 5/2012 | Päri et al. |
| 2019/0165441 A1 | 5/2019 | Adamsson et al. |

* cited by examiner

CAPACITIVE COUPLING TUNER

FIELD

Some example embodiments may generally relate to resonators, filters and/or multiplexers. For example, certain embodiments may relate to designs for resonators that may be used in filters and/or multiplexers that may be employed, e.g., in mobile or wireless telecommunication systems.

BACKGROUND

Examples of mobile or wireless telecommunication systems may include the Universal Mobile Telecommunications System (UNITS) Terrestrial Radio Access Network (UTRAN), Long Term Evolution (LTE) Evolved UTRAN (E-UTRAN), LTE-Advanced (LTE-A), MulteFire, LTE-A Pro, and/or fifth generation (5G) radio access technology or new radio (NR) access technology. Filters, such as radio frequency (RF) filters, and multiplexers are often employed for base station applications in such communications systems. Such filters may operate in the megahertz to gigahertz frequency ranges (medium frequency to extremely high frequency). One example of this type of filter is a dielectric filter that uses pucks made from a dielectric material to make a resonator.

SUMMARY

One embodiment is directed to an apparatus that may include at least one resonator. The apparatus may further include at least one input tap coupled to the at least one resonator via capacitive coupling. The apparatus may further include at least one tuning element that comprises at least one plate of material. At least a portion of the at least one tuning element may be configured to be positioned between the at least one resonator and the at least one input tap. The at least one tuning element may be configured to be positioned between the at least one resonator and the at least one input tap by at least one spring retention element.

In a variant, the at least one tuning element may comprise at least one slot through the at least one tuning element. In a variant, adhesive may be applied in the at least one slot of the at least one tuning element to secure the at least one tuning element in place to at least one other element of the apparatus. In a variant, the at least one plate of material may comprise at least one plate of dielectric material that has a dielectric constant of at least 2.0. In a variant, the at least one plate of dielectric material comprises polytetrafluoroethylene (PTFE) or polythermide (PEI).

In a variant, the apparatus may further comprise at least one tuning cover configured with at least one slot through the at least one tuning cover. In a variant, at least another portion of the at least one tuning element may extend through the at least one slot of the at least one tuning cover. In a variant, the at least one spring retention element may be inserted into the at least one slot of the at least one tuning cover. In a variant, the at least one spring retention element may be configured to position the at least one tuning element by applying spring retention to at least one surface of the at least one tuning element. In a variant, the spring retention element may be configured to provide spring retention to hold the at least one tuning element in the position by applying the spring retention to at least one surface that forms the at least one slot. In a variant, the at least one tuning element may comprise at least one shaped portion in the at least one portion.

In a variant, the at least one tuning element may be configured to be movable up and down to adjust a resonant frequency of the at least one resonator. In a variant, the apparatus may be included in a filter. In a variant, the apparatus may be included in a multiplexer.

Another embodiment is directed to a filter that may include an apparatus. The apparatus may include at least one resonator. The apparatus may further include at least one input tap coupled to the at least one resonator via capacitive coupling. The apparatus may further include at least one tuning element that comprises at least one plate of material. At least a portion of the at least one tuning element may be configured to be positioned between the at least one resonator and the at least one input tap. The at least one tuning element may be configured to be positioned between the at least one resonator and the at least one input tap by at least one spring retention element.

Another embodiment is directed to a multiplexer that may include an apparatus. The apparatus may include at least one resonator. The apparatus may further include at least one input tap coupled to the at least one resonator via capacitive coupling. The apparatus may further include at least one tuning element that comprises at least one plate of material. At least a portion of the at least one tuning element may be configured to be positioned between the at least one resonator and the at least one input tap. The at least one tuning element may be configured to be positioned between the at least one resonator and the at least one input tap by at least one spring retention element.

Another embodiment is directed to a method of assembling an apparatus. The method may include providing a resonator. The method may include providing an input tap. The input tap and the resonator may be coupled via capacitive coupling. The method may include inserting at least a portion of a tuning element between the resonator and the input tap. The tuning element may comprise a plate of material. At least another portion of the tuning element may not be disposed between the input tap and the resonator. The tuning element may be configured to be positioned between the input tap and the resonator by at least one spring retention element.

In a variant, the method may further include adjusting a resonant frequency of the resonator by moving the tuning element up and down via the at least another portion of the tuning element. In a variant, the plate of material may comprise a plate of dielectric material. In a variant, the method may further include assembling the apparatus into a filter or a multiplexer after inserting the at least a portion of the tuning element between the input tap and the input resonator.

Another embodiment is directed to a method of tuning a resonator. The method may include inserting at least a portion of a tuning element between an input tap and the resonator such that at least another portion of the tuning element is not disposed between the input tap and the resonator. The resonator and the input tap may be coupled via capacitive coupling. The tuning element may comprise a plate of material. The tuning element may be configured to be positioned between the input tap and the resonator by at least one spring retention element. The method may include adjusting a resonant frequency of the resonator by moving the tuning element up and down via the at least another portion of the tuning element.

BRIEF DESCRIPTION OF THE DRAWINGS

For proper understanding of example embodiments, reference should be made to the accompanying drawings, wherein.

DETAILED DESCRIPTION

Figure 1:
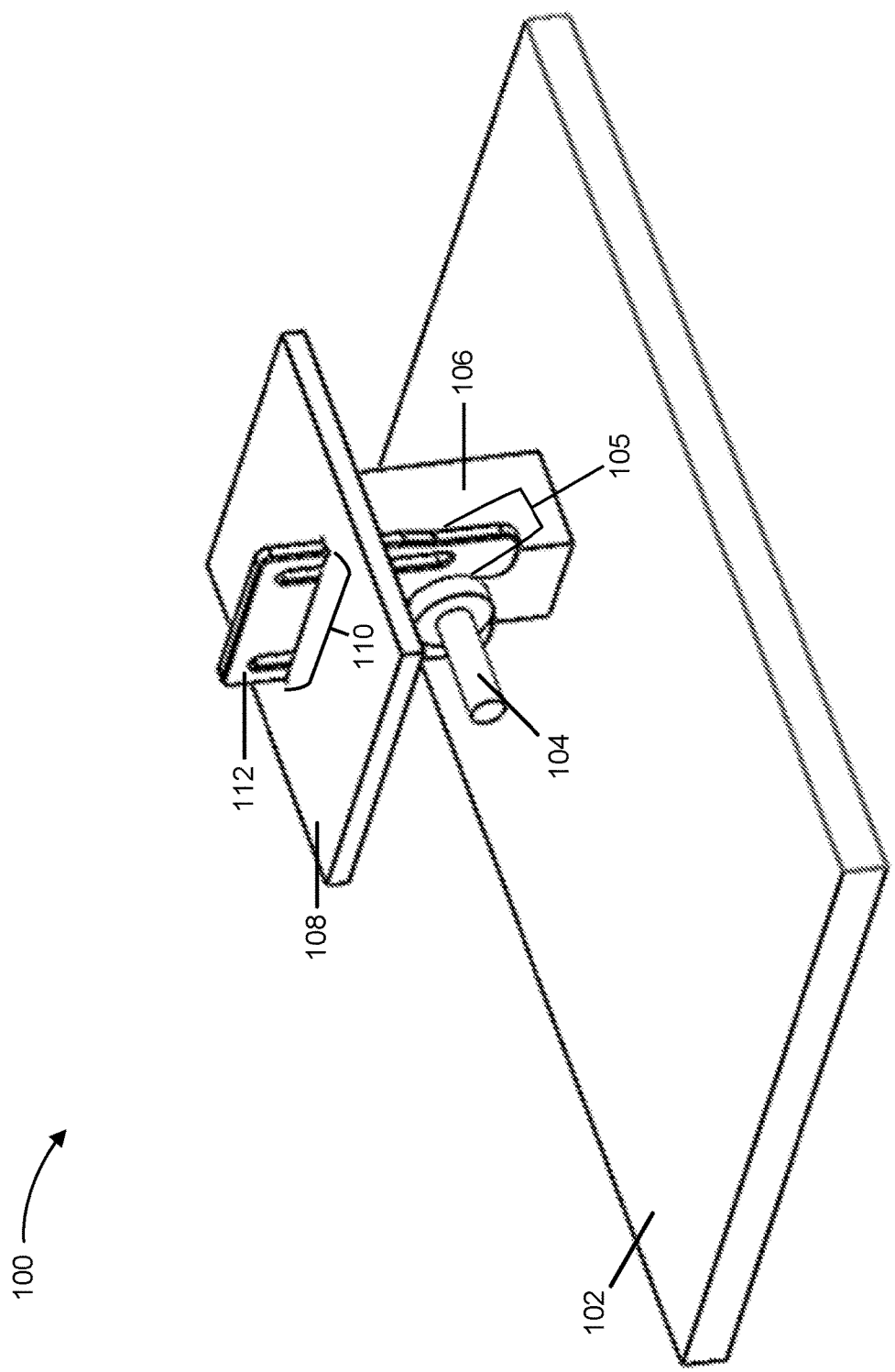
FIG. 1 illustrates an example apparatus, according to some embodiments.

It will be readily understood that the components of certain example embodiments, as generally described and illustrated in the figures herein, may be arranged and designed in a wide variety of different configurations. Thus, the following detailed description of some example embodiments of a dielectric tuning element that reduces the size and improves tenability of filters and/or multiplexers, is not intended to limit the scope of certain embodiments but is representative of selected example embodiments.

The features, structures, or characteristics of example embodiments described throughout this specification may be combined in any suitable manner in one or more example embodiments. For example, the usage of the phrases "certain embodiments," "some embodiments," or other similar language, throughout this specification refers to the fact that a particular feature, structure, or characteristic described in connection with an embodiment may be included in at least one embodiment. Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more example embodiments.

Radio frequency (RF) filters may be used in various types of RF devices, such as a user equipment (UE), a network node, such as a base station (BS), an Internet of Things (IoT) device, and/or the like. Specifically, an RF filter may be used to construct a multiplexer or other component of these types of devices. One type of RF filter used may be a dielectric filter, where a puck of a dielectric material is placed between elements of the RF filter to achieve a specific resonant frequency of a resonator. These pucks of material may have to be specifically constructed for the RF filter, which may be a costly and time-consuming process.

In addition, the types of devices and/or components in which RF filters may be used are becoming smaller in size. This may significantly reduce the tolerance of tuning a resonator, thereby significantly increasing the difficulty of using these types of elements. The reduced tolerances and increased difficulty may result in decreased performance and/or increased failure of an RF filter constructed using a dielectric puck and/or a device (or component of the device) in which the RF filter may be used, can increase costs and/or resource consumption with respect to assembling the RF filters, and/or the like. As such, there is a significant need for RF filters that are easily assembled and/or tuned.

Some embodiments described herein provide an RF filter that may comprise a tuning element in the form of a plate of material between an input tap and a resonator of the RF filter, where a positioning of the tuning element can be adjusted vertically in an up and down manner to adjust a resonant frequency of the resonator, as described elsewhere herein. In addition, the up and down positioning of the tuning element may be maintained by a spring retention element after movement of the tuning element. Thus, some embodiments described herein may reduce or eliminate a need for individual construction and/or tuning of dielectric pucks for an RF filter. This may provide a way to compensate for reduced device size and/or tighter tolerances, which may thereby reduce costs of assembly, improve operation of an RF filter, reduce failure rate, and/or the like.

FIG. 1 illustrates an example apparatus, according to some embodiments. FIG. 1 illustrates an apparatus 100 that may be included in an RF filter, a multiplexer, and/or the like of a wireless communication device. Although various elements of the apparatus 100 will be described below and are shown in FIG. 1, it should be noted that the elements described below and/or shown in FIG. 1 may only comprise a subset of the elements included in the apparatus 100. In addition, only a portion of the elements described below may be illustrated in FIG. 1 to aid with illustration and/or explanation of the elements of the apparatus 100.

The apparatus 100 may include a substrate 102 of a housing (not fully shown in FIG. 1). Substrate 102 may form a bottom wall of the housing of the apparatus 100. In addition, one or more other elements of the apparatus 100 may be mechanically supported by and/or electrically connected to the substrate 102. For example, the substrate 102 may comprise aluminum or another metallic material to which elements may be mechanically and/or electrically connected.

The apparatus 100 may further include an input tap 104. The input tap 104 may be connected to an antenna of a device (not shown). For example, the input tap 104 may include one or more elements configured to receive an RF signal from the antenna and/or to provide the RF signal to one or more other elements of the device, as described herein. The apparatus 100 may further include an input resonator 106. For example, the input resonator 106 may include one or more elements configured to receive an RF signal from the input tap 104. The input resonator 106 may be mechanically supported by and/or electrically connected to the substrate 102. In addition, the input tap 104 and the input resonator 106 may be coupled to each other via capacitive coupling illustrated by reference number 105.

The apparatus 100 may further include a tuning cover 108. For example, the tuning cover 108 may form a top wall of a housing of the apparatus 100. One or more elements of the apparatus 100 may be mechanically supported by and/or electrically connected to the tuning cover 108. For example, the tuning cover 108 may comprise aluminum or another metallic material to which elements may be mechanically and/or electrically connected. The tuning cover 108 may include a slot 110 through the tuning cover 108. For example, the slot 110 may be defined completely through the tuning cover 108 such that the slot 110 provides access to an interior of a housing of the apparatus 100. In addition, a size and/or shape of the slot 110 may be configured to allow insertion of one or more other elements into the slot 110 and/or to maintain a positioning of the one or more other elements, as will be described below.

The apparatus 100 may include a tuning element 112. The tuning element 112 may be a plate of material comprising a dielectric material. For example, the plate of material may comprise polytetrafluoroethylene (PTFE), polythermide (PEI), and/or another material that may have, for example, a dielectric constant of at least 2.0. As illustrated in FIG. 1, the tuning element 112 may be positioned such that at least a portion of the tuning element 112 is disposed between the input tap 104 and the input resonator 106 based on a vertical positioning of the tuning element 112. In addition, as illustrated in FIG. 1, at least a portion of the tuning element 112 may extend through the slot 110 to an exterior of a housing of the apparatus 100.

In some embodiments, a positioning of the tuning element 112 may be adjusted vertically and/or laterally. For example, the extension of the tuning element 112 through the slot 110 may allow for the tuning element 112 to be adjusted up and down from an exterior of the tuning cover 108 via the portion(s) of the tuning element 112 that extend through the slot 110. Vertical and/or horizontal adjustment of the tuning element 112 may adjust an amount of the tuning element 112 that is between the input tap 104 and the input resonator 106. The amount of tuning element 112 that is positioned between these two components may impact a resonant frequency of the input resonator 106. In addition, extension through the slot 110 allows for the tuning element 112 to be mechanically connected to the tuning cover 108 to secure the tuning element 112 in a particular position. The tuning element 112 may include one or more other elements that will be described below in more detail.

As indicated above, FIG. 1 is provided as an example. Other examples are possible, according to certain embodiments.

Figure 2:
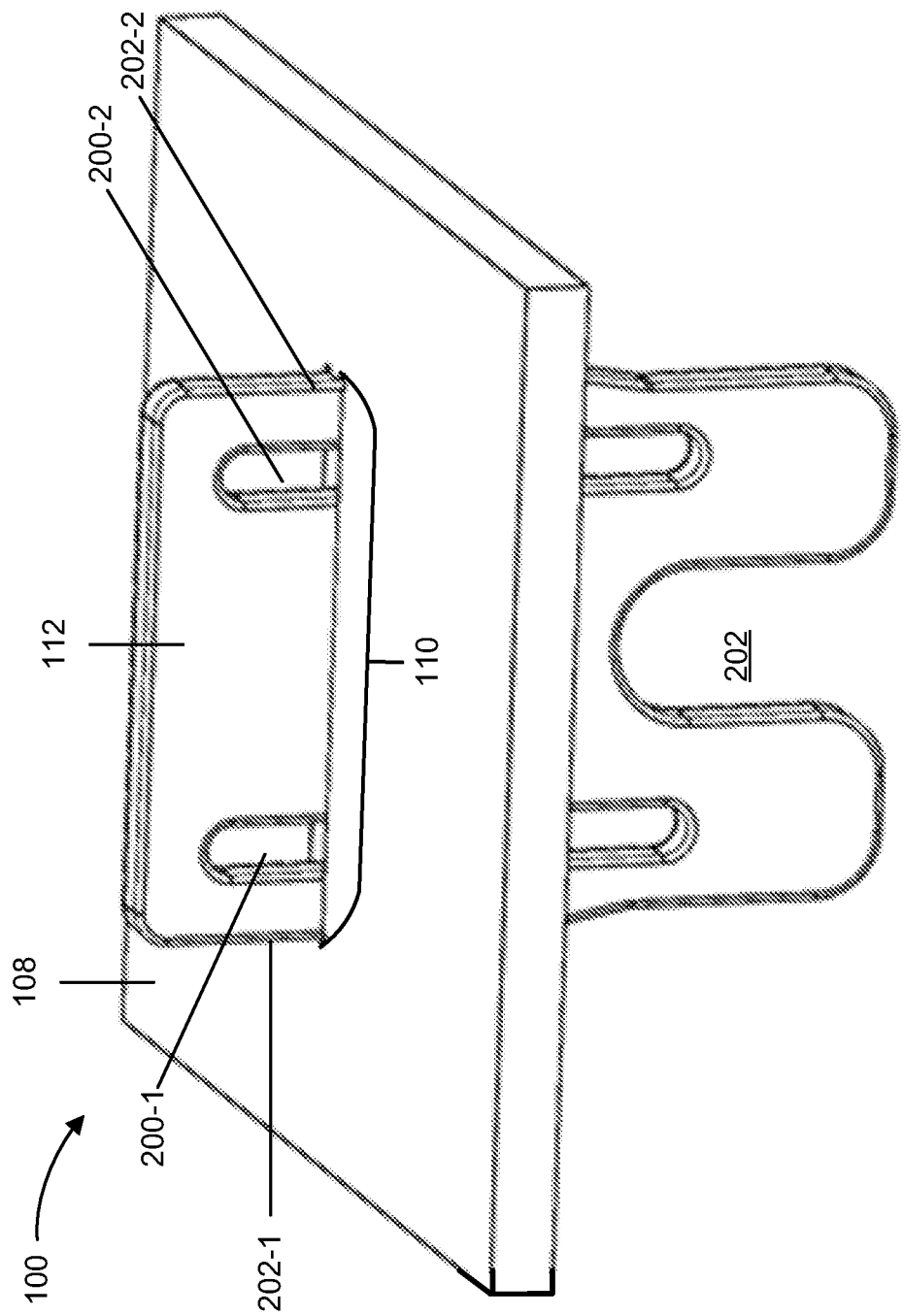
FIG. 2 illustrates a subset of the elements of the example apparatus of FIG. 1, according to some embodiments.

FIG. 2 illustrates a subset of the elements of the example apparatus of FIG. 1, according to some embodiments. For example, FIG. 2 illustrates the tuning cover 108, the slot 110, and the tuning element 112 of the apparatus 100 of FIG. 1.

The tuning element 112 may include one or more slots 200 through the tuning element 112. For example, the tuning element 112 is illustrated in FIG. 2 as including a slot 200-1 and a slot 200-2. In some embodiments, the slots 200 may have a shape and/or size where at least a portion of the slots 200 aligns with surfaces of the tuning cover 108 that form the slot 110. For example, the slots 200 illustrated in FIG. 2 extend from one side of the tuning cover 108, through the slot 110 past the previously described surfaces, and to a point on another side of the tuning cover 108. This configuration may allow for adhesive to be applied into the slots 200 to secure the tuning element 112 in a position. The slots 200 may allow for other uses, such as insertion of tools into the housing of the apparatus 100, insertion of tools for adjustment of the tuning element 112, mechanical attachment to another element of an RF filter and/or a multiplexer, and/or the like.

The tuning element 112 may include one or more elements on sides 202 of the tuning element 112, e.g., sides 202-1 and 202-2, to facilitate maintenance of a positioning of the tuning element 112. For example, the one or more elements may include a spring retention element. The spring retention element may be configured such that it can be pinched towards the tuning element 112 for insertion of the tuning element 112 into the slot 110 and/or adjustment of the positioning of the tuning element 112. In addition, the spring retention element may be configured to expand to press against surfaces of the tuning cover 108 when released to maintain the positioning of the tuning element 112. Other surfaces of the tuning element 112 may include similar spring retention elements.

The portion of the tuning element 112 that can be positioned or placed between the input tap 104 and the input resonator 106 may include a shaped portion, such as an indentation, a cutout, a molded shape, a protrusion, and/or the like. As an example, FIG. 2 illustrates a U-shaped portion 202 (e.g., formed during molding or by removal of material) in the portion of the tuning element 112 that is to be between the input tap 104 and the input resonator 106. The shaped portion may control an amount of material between the input tap 104 and the input resonator 106 to allow for, for example, graded and/or fine adjustment of a resonant frequency of the input resonator 106.

As indicated above, FIG. 2 is provided as an example. Other examples are possible, according to certain embodiments.

Figure 3:
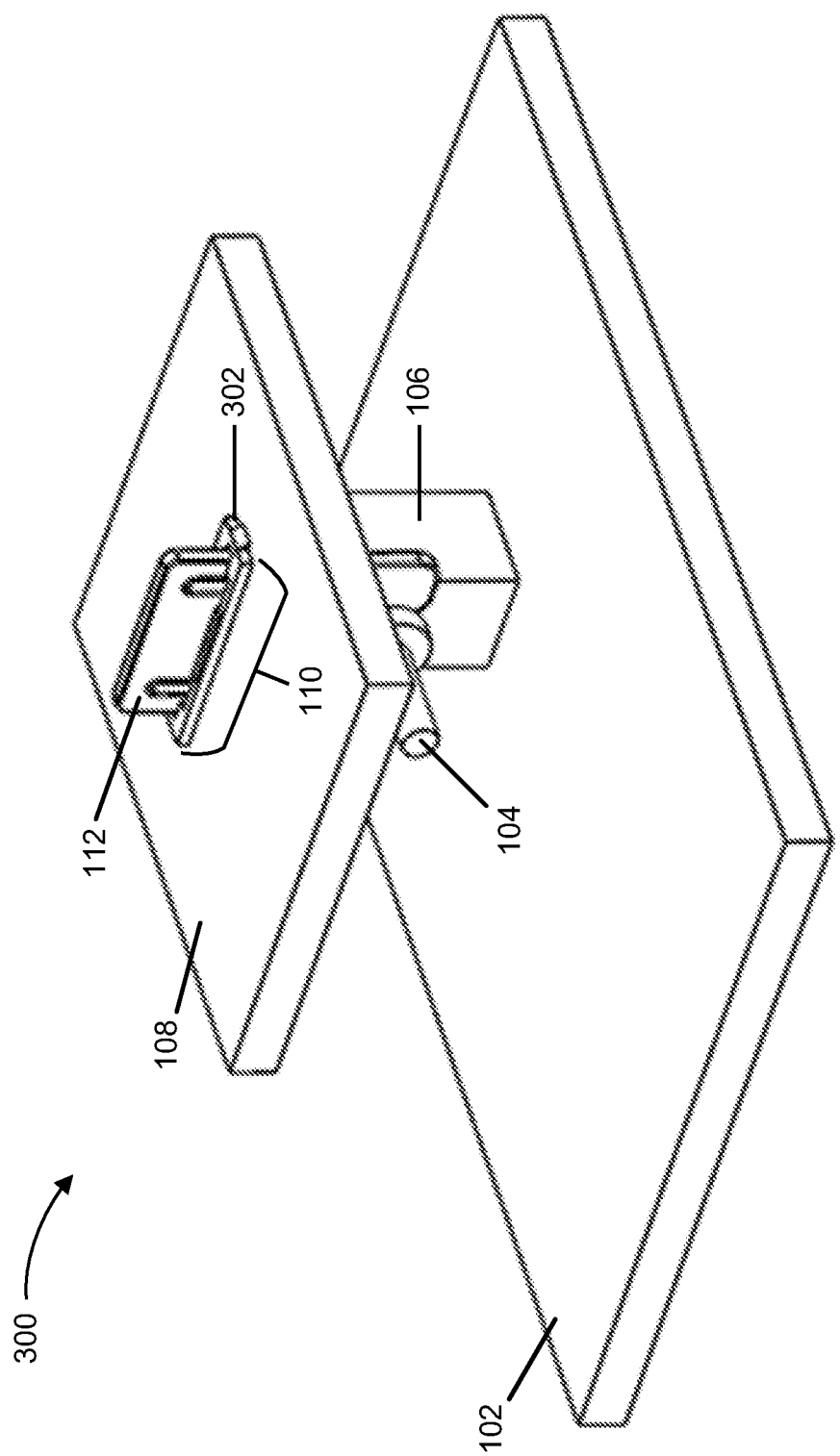
FIG. 3 illustrates another example apparatus, according to some embodiments.

FIG. 3 illustrates another example apparatus, according to some embodiments. Specifically, FIG. 3 illustrates an apparatus 300 that includes the substrate 102, the input tap 104, the input resonator 106, the tuning cover 108, and slot 110, and the tuning element 112 described above with respect to the apparatus 100 illustrated in FIG. 1. In addition to these elements, the apparatus 300 includes a spring retention element 302 inserted into the slot 110. For example, the spring retention element 302 may be a spring retainer that is inserted into the slot 110 and that is a separate element from other elements of the apparatus 300. The spring retention element 302 may have a shape that facilitates installation of the tuning element 112 into the apparatus 300 (e.g., the spring retention element 302 may have a shape that outlines, or partially outlines, the slot 110 allowing for the tuning element 112 to be inserted into the slot 110).

The spring retention element 302 may comprise metal, plastic, a carbon alloy, and/or the like. In some embodiments, the spring retention element 302 may comprise a non-magnetic material. The spring retention element 302 may include one or more springs elements that are configured to press against one or more surfaces of the tuning element 112 when the tuning element 112 is installed in the slot 110. In this way, the spring elements of the spring retention element 302 may hold the tuning element 112 in a particular position. Additionally, the spring elements and/or the spring retention element 302 may include one or more locking elements to interlock with locking elements of the tuning element 112. For example, the locking elements of the spring retention element 302 and the tuning element 112 may include corresponding male and female locking elements.

As indicated above, FIG. 3 is provided as an example. Other examples are possible, according to some embodiments.

Figure 4:
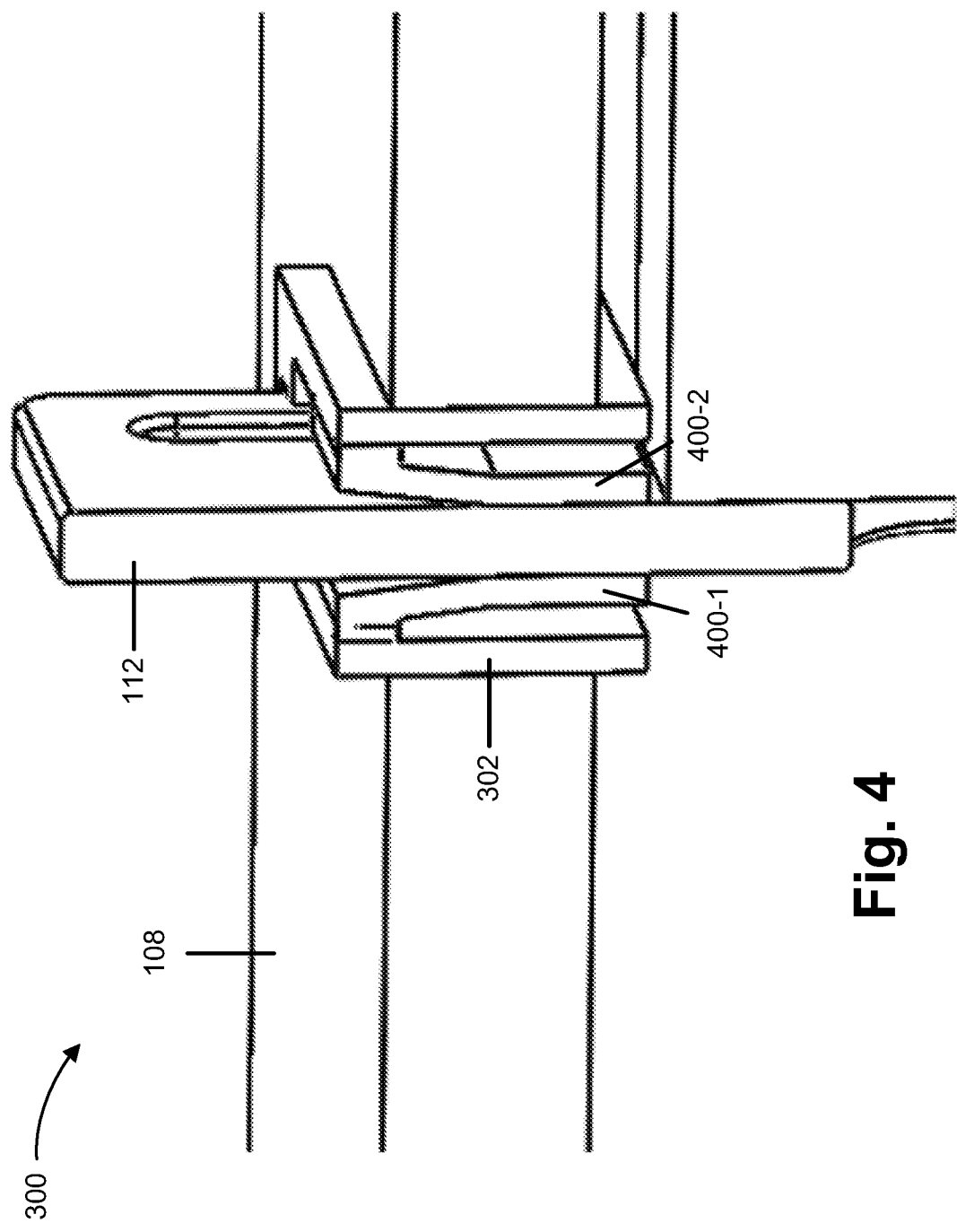
FIG. 4 illustrates a cross-sectional view of a subset of the elements of the example apparatus of FIG. 3, according to some embodiments.

FIG. 4 illustrates a cross-sectional view of a subset of the elements of the example apparatus of FIG. 3, according to some embodiments. For example, FIG. 4 illustrates a cross-sectional view of the tuning cover 108, the tuning element 112, the spring retention element 302, and spring elements 400 of the spring retention element 302 (e.g., spring elements 400-1 and 400-2). As illustrated in FIG. 4, each of the spring elements 400 may comprise one or more plates of material that are configured to extend into an interior of the slot 110 (reference number not shown), such that the plates of material press against the tuning element 112 when the tuning element 112 has been inserted into the slot 110. This mechanical pressure applied by the spring elements 400 may maintain a position of the tuning element 112.

As indicated above, FIG. 4 is provided as an example. Other examples are possible, according to certain embodiments.

Figure 5:
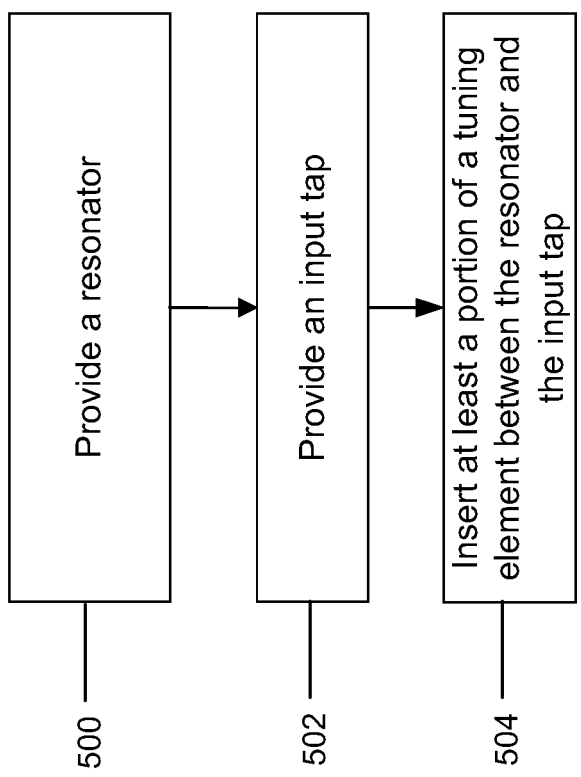
FIG. 5 illustrates an example flowchart of a method of assembling an apparatus, according to some embodiments.

FIG. 5 illustrates an example flowchart of a method of assembling an apparatus, according to some embodiments. For example, FIG. 5 illustrates an example method of assembling apparatus 100 and/or apparatus 300.

As illustrated in FIG. 5, the method may include, at 500, providing a resonator. For example, the method may include providing a resonator 106. In some embodiments, providing the resonator may include mechanically and/or electrically connecting the resonator to a substrate (e.g., substrate 102) in a manner similar to that illustrated in FIGS. 1 and 3 and/or to one or more other elements of the apparatus. Additionally, or alternatively, providing a resonator may include attaching the resonator to a workbench, securing the resonator in machinery, and/or the like.

As illustrated in FIG. 5, the method may include, at 502, providing an input tap. For example, the method may include providing an input tap 104. In some embodiments, providing the input tap may include mechanically and/or electrically connecting the input tap to a substrate, to an antenna, and/or to one or more other elements of the apparatus. Additionally, or alternatively, providing the input tap may include attaching the input tap to a workbench, securing the input tap in machinery, and/or the like. In some embodiments, the input tap and the resonator may be coupled via capacitive coupling after providing the input tap and the resonator.

As illustrated in FIG. 5, the method may include, at 504, inserting at least a portion of a tuning element between the resonator and the input tap. For example, the method may include inserting at least a portion of a tuning element 112 between the resonator 106 and the input tap 104. In some embodiments, inserting the at least a portion of the tuning element may include positioning the tuning element with respect to one or more other elements of the apparatus in a manner similar to that illustrated in FIGS. 1-4. For example, inserting the at least a portion may include inserting the tuning element through a slot (e.g., a slot 110) in a tuning cover (e.g., tuning cover 108) such that the at least a portion is disposed between the input tap and the resonator.

In some embodiments, the tuning element may comprise a plate of material that comprises a spring retention element. For example, sides 202 of the tuning element 112 may comprise the spring retention element. In some embodiments, at least another portion of the tuning element may not be disposed between the input tap and the resonator (e.g., may extend through a slot to an exterior of a housing of the apparatus). In some embodiments, the tuning element may be configured to be positioned between the input tap and the resonator by the spring retention element. For example, the tuning element may be held in a position by spring retention applied by a spring retention element 302 (e.g., a spring retainer) or spring elements 400 thereof, by spring elements included in the tuning element, and/or the like, in a manner similar to that shown in FIGS. 1-4. In some embodiments, the spring retention element of the tuning element may be configured to provide spring retention to hold the at least one tuning element in the position by applying the spring retention to at least one surface that forms the at least one slot.

In some embodiments, the tuning element may be configured to be movable up and down in a vertical direction. In some embodiments, the method may include adjusting a resonant frequency of the resonator by moving the tuning element up and down via the at least another portion of the tuning element. For example, the resonant frequency of an input resonator 106 may be adjusted by moving a tuning element 112 up and down to adjust an amount of the tuning element 112 that is disposed between an input tap 104 and a resonator 106.

In some embodiments, the tuning element may comprise at least one shaped portion in the at least one portion and adjusting the resonant frequency may comprise adjusting an amount of the at least one shaped portion between the input tap and the resonator. In some embodiments, the method may include assembling the apparatus into a filter or a multiplexer after inserting the at least a portion of the tuning element between the input tap and the input resonator. In some embodiments, the apparatus may be assembled into a filter or a multiplexer, and the filter or the multiplexer may further be assembled into a wireless communication device, such as a UE, a network node, and/or the like.

In some embodiments, the tuning element may comprise at least one slot through the tuning element. In some embodiments, adhesive may be applied in the at least one slot of the tuning element to secure the tuning element in place to at least one other element of the apparatus. In some embodiments, the at least one plate of material may comprise at least one plate of dielectric material that may have, for example, a dielectric constant of at least 2.0. In some embodiments, the at least one plate of dielectric material may comprise polytetrafluoroethylene (PTFE) or polythermide (PEI).

In some embodiments, the method may further include providing a tuning cover configured with at least one slot through the tuning cover. In some embodiments, the method may further include providing a spring retainer and inserting the spring retainer into the slot of the tuning cover. The spring retainer may be configured to position the at least one tuning element between the input tap and the resonator.

As indicated above, FIG. 5 is provided merely as an example. Other examples are possible, according to certain embodiments.

Figure 6:
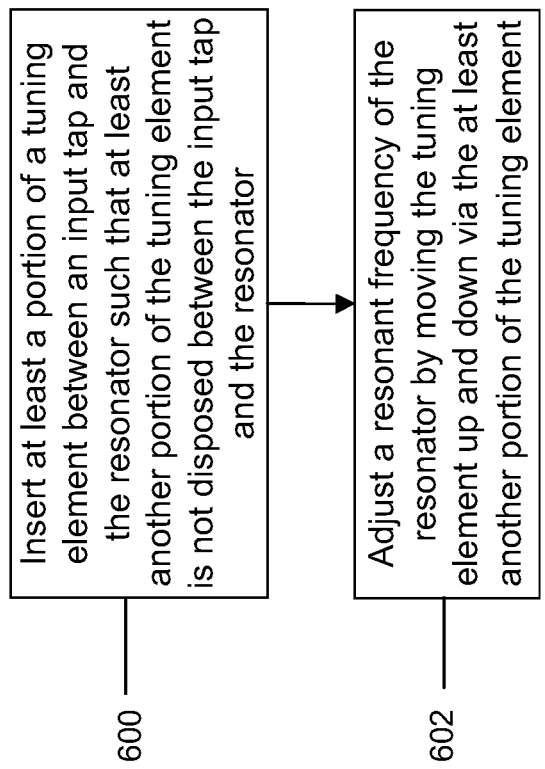
FIG. 6 illustrates an example flowchart of a method of tuning a resonator, according to some embodiments.

FIG. 6 illustrates an example flowchart of a method of tuning a resonator, according to some embodiments. For example, FIG. 6 illustrates an example method of tuning an input resonator 106, an apparatus 100, and/or an apparatus 300.

As illustrated in the example of FIG. 6, the method may include, at 600, inserting at least a portion of a tuning element between an input tap and the resonator such that at least another portion of the tuning element is not disposed between the input tap and the resonator. For example, the method may include inserting at least a portion of a tuning element 112 between an input tap 104 and the resonator 106 such that at least another portion of the tuning element 112 is not disposed between the input tap 104 and the resonator 106. In some embodiments, the method may include inserting the tuning element through a slot (e.g., a slot 110) in a housing of the apparatus, in a manner similar to that described elsewhere herein. In some embodiments, the resonator and the input tap may be coupled via capacitive coupling. In some embodiments, the tuning element may comprise a plate of material. The tuning element may be configured to be positioned between the input tap and the resonator by a spring retention element.

As illustrated in FIG. 6, the method may include, at 602, adjusting a resonant frequency of the resonator by moving the tuning element up and down via the at least another portion of the tuning element. For example, the method may include adjusting a resonant frequency of the resonator 106 by moving the tuning element 112 up and down via the at least another portion of the tuning element 112. In some embodiments, adjusting the resonant frequency may comprise adjusting a positioning, between the input tap and the resonator, of at least one shaped portion included in the at least a portion. For example, adjusting the resonant frequency may comprise adjusting a positioning, between the input tap 104 and the resonator 106, of at least one U-shaped portion 202 included in the at least a portion. In some embodiments, the apparatus may further comprise a tuning cover configured with a slot through the tuning cover and at least another portion of the tuning element may extend through the slot of the tuning cover. In this case, adjusting the resonant frequency may include moving the tuning element up and down through the slot.

In some embodiments, the tuning element may comprise at least one slot through the tuning element. In some embodiments, the method may include inserting an adhesive into the at least one slot through the tuning element to secure the tuning element to one or more other elements of the apparatus. For example, the method may include inserting an adhesive into at least one slot 200 through the tuning element 112 to secure the tuning element 112 to one or more other elements of the apparatus (e.g., a tuning cover 108, the input tap 104, the resonator 106, and/or a spring retention element 302).

In some embodiments, the plate of material may comprise at least one plate of dielectric material that may have, for example, a dielectric constant of at least 2.0. In some embodiments, the at least one plate of dielectric material may comprise polytetrafluoroethylene (PTFE) or polythermide (PEI).

In some embodiments, the apparatus may further include a spring retainer (e.g., a spring retention element 302) inserted into the slot of the tuning cover. The spring retainer may be configured to position the tuning element between the input tap and the resonator. In some embodiments, the spring retention element of the tuning element may be configured to provide spring retention to hold the at least one tuning element in the position by applying the spring retention to at least one surface that forms the at least one slot. In some embodiments, the apparatus may be included in a filter. In some embodiments, the apparatus may be included in a multiplexer.

As indicated above, FIG. 6 is provided merely as an example. Other examples are possible.

Therefore, certain example embodiments provide several technological improvements, enhancements, and/or advantages over existing devices or technological processes and constitute an improvement at least to the technological fields of resonators, filters, and/or multiplexers, for example that may be used in wireless networks. For example, one advantage or improvement provided by example embodiments may include a reduction in resonator size, thereby also resulting in reduced size for filters and/or multiplexers that employ resonators. In addition, some embodiments allow for improved tuning of a resonator via adjustment of a tuning element in the manner described herein. It should be understood that advantages or improvements achievable by example embodiments are not merely limited to those discussed herein.

Example embodiments described herein apply equally to both singular and plural implementations, regardless of whether singular or plural language is used in connection with describing certain embodiments. For example, an embodiment that describes an apparatus as including a single instance of an element equally applies to embodiments that include multiple instances of the element, and vice versa.

One having ordinary skill in the art will readily understand that the example embodiments as discussed above may be practiced with procedures in a different order, and/or with hardware elements in configurations which are different than those which are disclosed. Therefore, although some embodiments have been described based upon these example embodiments, it would be apparent to those of skill in the art that certain modifications, variations, and alternative constructions would be apparent, while remaining within the spirit and scope of example embodiments. In order to determine the metes and bounds of example embodiments, reference can be made to the appended claims.

We claim:

1. An apparatus, comprising:
at least one resonator;
at least one input tap coupled to the at least one resonator via capacitive coupling; and
at least one tuning element that comprises at least one plate of material,
wherein at least a portion of the at least one tuning element is configured to be positioned between the at least one resonator and the at least one input tap, and
wherein the at least one tuning element is configured to be positioned between the at least one resonator and the at least one input tap by at least one spring retention element,
wherein the at least one tuning element comprises at least one slot through the at least one tuning element,
wherein the at least one slot is configured, with the at least one spring retention element, to retain a positioning of the at least one tuning element between the at least one input tap and the at least one resonator at a vertical position with respect to at least one horizontal tuning cover comprising at least another slot through which at least another portion of the at least one tuning element extends and through which the at least one tuning element is configured to move up and down vertically.

2. The apparatus according to claim 1, wherein adhesive is applied in the at least one slot of the at least one tuning element to secure the at least one tuning element in place to at least one other element of the apparatus.

3. The apparatus according to claim 1, wherein the at least one plate of material comprises at least one plate of dielectric material that has a dielectric constant of at least 2.0.

4. The apparatus according to claim 3, wherein the at least one plate of dielectric material comprises polytetrafluoroethylene (PTFE) or polythermide (PEI).

5. The apparatus according to claim 1, wherein the at least one spring retention element is inserted into the at least another slot of the at least one horizontal tuning cover,
wherein the at least one spring retention element is configured to position the at least one tuning element by applying spring retention to at least one surface of the at least one tuning element.

6. The apparatus according to claim 1, wherein the at least one spring retention element is configured to provide spring retention to hold the at least one tuning element in the position by applying the spring retention to at least one surface that forms the at least one slot.

7. The apparatus according to claim 1, wherein the at least one tuning element comprises at least one shaped portion in the at least one portion.

8. The apparatus according to claim 1, wherein the at least one tuning element is configured to be movable up and down vertically to adjust a resonant frequency of the at least one resonator.

9. The apparatus according to claim 1, wherein the apparatus is included in a filter.

10. The apparatus according to claim 1, wherein the apparatus is included in a multiplexer.

11. A method of assembling an apparatus, the method comprising:
provided a resonator;
providing an input tap,
wherein the input tap and the resonator are coupled via capacitive coupling; and
inserting at least a portion of a tuning element between the resonator and the input tap,
wherein the tuning element comprises a plate of material,
wherein at least another portion of the tuning element is not disposed between the input tap and the resonator, and
wherein the tuning element is configured to be positioned between the input tap and the resonator by a spring retention element,
wherein the tuning element comprises at least one slot through the tuning element,
wherein the at least one slot is configured, with the spring retention element, to retain a positioning of the tuning element between the input tap and the resonator at a vertical position with respect to a horizontal tuning cover comprising another slot through which at least a portion of the at least another portion of the tuning element extends and through which the tuning element is configured to move vertically.

12. The method according to claim 11, further comprising:
adjusting a resonant frequency of the resonator by moving the tuning element up and down vertically via the at least another portion of the tuning element.

13. The method according to claim 11, wherein the plate of material comprises a plate of dielectric material.

14. The method according to claim 11, further comprising:
assembling the apparatus into a filter or a multiplexer after inserting the at least a portion of the tuning element between the input tap and the input resonator.

15. A method of tuning a resonator, comprising:
inserting at least a portion of a tuning element between an input tap and the resonator such that at least another portion of the tuning element is not disposed between the input tap and the resonator,
wherein the resonator and the input tap are coupled via capacitive coupling,
wherein the tuning element comprises a plate of material,
wherein the tuning element is configured to be positioned between the input tap and the resonator by a spring retention element,
wherein the tuning element comprises at least one slot through the tuning element,
wherein the at least one slot is configured, with the spring retention element, to retain a positioning of the tuning element between the input tap and the resonator at a vertical position with respect to a horizontal tuning cover comprising another slot through which another portion of the tuning element extends and through which the tuning element is configured to move up and down vertically; and
adjusting a resonant frequency of the resonator by moving the tuning element up and down vertically via the at least another portion of the tuning element.

16. The method according to claim 15, further comprising:
inserting an adhesive into the at least one slot through the tuning element to secure the tuning element to one or more other elements of an apparatus.

17. The method according to claim 15, wherein the tuning element is configured to increase a capacitance between the input tap and the resonator based on the vertical position of the tuning element.

18. The method according to claim 15, wherein adjusting the resonant frequency comprises:
adjusting the positioning, between the input tap and the resonator, of at least one shaped portion included in the at least a portion.

* * * * *